United States Patent [19]

Xiang et al.

[11] Patent Number: 5,994,902
[45] Date of Patent: Nov. 30, 1999

[54] CHEMICAL SHIFT IMAGING WITH SPECTRUM MODELING

[75] Inventors: Qing-San Xiang, Vancouver, Canada; Li An, Stafford, Tex.

[73] Assignee: The University of British Columbia, Vancouver, Canada

[21] Appl. No.: 09/058,317

[22] Filed: Apr. 9, 1998

Related U.S. Application Data

[60] Provisional application No. 60/042,538, Apr. 10, 1997.

[51] Int. Cl.[6] ........................................... G01V 3/00
[52] U.S. Cl. ......................... 324/307; 324/309; 324/314; 600/414; 436/173
[58] Field of Search ..................... 324/307, 309, 324/310, 311, 312, 314; 600/414; 436/173

[56] References Cited

U.S. PATENT DOCUMENTS

| | | | |
|---|---|---|---|
| 4,797,615 | 1/1989 | Rotem et al. | 324/307 |
| 5,321,359 | 6/1994 | Schneider | 324/307 |

OTHER PUBLICATIONS

Xiang, Q.–S., et al., "General 3–Point Water–Fat Imaging with Optimized SNR," *Proceedings of the Fourth Annual Scientific Meeting of the International Society for Magnetic Resonance in Medicine*, New York, NY, Apr. 27–May 23, 1996.

Brown, T.R., et al., "NMR chemical shift imaging in three dimensions," *Proc. Natl. Acad. Sci. USA*, vol. 79, Jun. 1982, pp. 3523–3526.

Maudsley, A.A., et al., "Spatially Resolved High Resolution Spectroscopy by 'Four–Dimensional' NMR," *Journal of Magnetic Resonance*, Communications, vol. 51, 1983, pp. 147–152.

Dixon, W.T., "Simple Proton Spectroscopic Imaging," *Radiology*, vol. 153, Oct. 1984, pp. 189–194.

Glover, G.H., et al., "Three–Point Dixon Technique for True Water/Fat Decomposition with $B_0$ Inhomogeneity Correction," *Magnetic Resonance in Medicine*, vol. 18, 1991, pp. 371–383.

Szumowski, J., et al., "Phase Unwrapping in the Three–Point Dixon Method for Fat Suppression MR Imaging," *Radiology*, Aug. 1994, vol. 192, pp. 555–561.

*Primary Examiner*—Christine Oda
*Assistant Examiner*—Bry B. Shrivastav
*Attorney, Agent, or Firm*—Christensen O'Connor Johnson & Kindness PLLC

[57] ABSTRACT

Chemical shift imaging with spectrum modeling (CSISM) models the general chemical shift spectrum as a system with N distinct peaks with known resonant frequencies and unknown amplitudes. Based on the N peak spectrum model, a set of nonlinear complex equations is set up that contains N+1 unknowns of two kdnds: the magnitudes of the N peaks, and a phasor map caused by main magnetic field inhomogeneity. Using these equations, the timing parameters for shifting the 180° RF refocusing pulses for acquiring spin-echo images are optimally chosen. Corresponding timing parameters for other pulse sequences can also be optimized similarly. Using the chosen timing parameters, a plurality of images are acquired. Next, acquired image data are automatically processed to solve the complex linear equations. First, the phasor map is found by fitting various phasor map values over a small number of pixels, or "seeds", that are picked sparsely in a field of view. Second, from the original "seeds", the region of pixels that are picked to find the best-fit phasor map is grown into the entire field of view, based on a predetermined phase difference between the original seed and a neighboring pixel. The optimal phasor map value is then entered into the complex linear equations to derive the only unknown values at this point—the peak amplitudes. Optionally, second pass solutions of the peak amplitudes may be obtained using a smoothed phasor map value. When the equations are solved, the spectroscopic images are output.

10 Claims, 2 Drawing Sheets

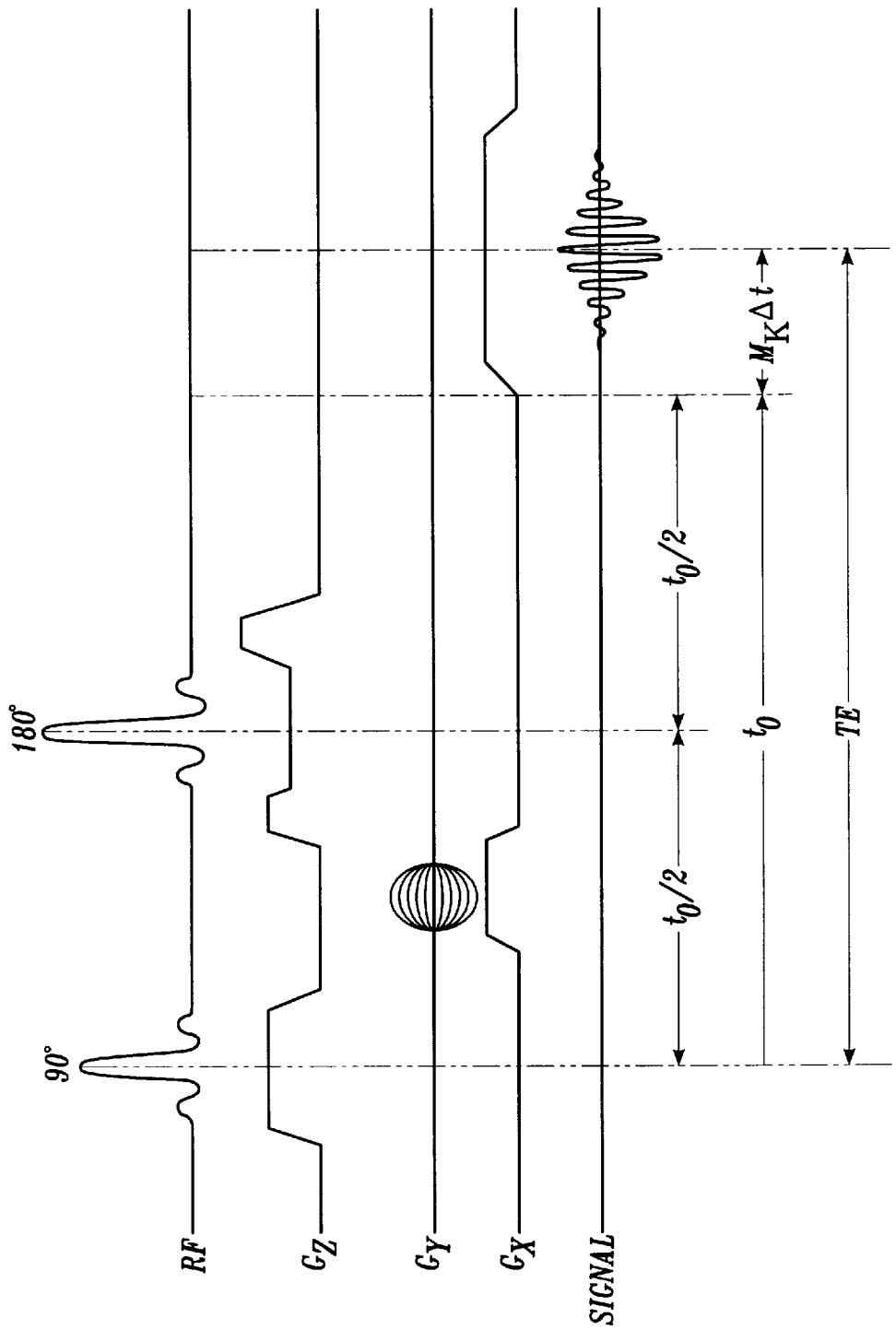

CHEMICAL SHIFT IMAGING WITH SPECTRUM MODELING

CROSS-REFERENCE TO RELATED APPLICATION

This application claims the benefit of U.S. provisional application Ser. No. 60/042,538, filed Apr. 10, 1997.

FIELD OF THE INVENTION

The invention relates to chemical shift imaging (CSI) and, more particularly, to a CSI with spectrum modeling (CSISM).

BACKGROUND OF THE INVENTION

Magnetic resonance imaging (MRI) is a medical patient diagnostic technology for producing high-quality images noninvasively. When MRI is combined with magnetic resonance spectroscopy (MRS), a chemical shift spectrum within each MRI pixel or, equivalently, images of different chemical species can be obtained, allowing more detailed studies of the subject. This procedure is termed spectroscopic imaging or chemical shift imaging (CSI) and has a great diagnostic potential.

One major practical problem of CSI is its very long data acquisition time, as compared to ordinary MRI. The long acquisition time is due to the additional chemical shift dimension to be resolved using a Fourier transform. For example, CSI can take 200 to 300 times longer than a standard MRI to achieve the same spatial resolution. Thus, a three-minute scan can become 13 hours long. In order to achieve practical scan times, CSI usually is performed with very low spatial resolution. Unfortunately, low spatial resolution may degrade the spectral resolution due to larger magnetic field ($B_0$) inhomogeneity per pixel, partial volume, and truncation artifacts. This results in difficulty in identifying and quantifying each chemical shift peak in the spectrum of each pixel. In addition, currently available CSI data processing is complex, time consuming, and somewhat unreliable.

To address the limitations of CSI in the context of water-fat imaging, Dixon introduced a method of modeling the proton spectrum of water-fat in tissue as two delta functions in W. T. Dixon, "Simple Proton Spectroscopic Imaging", *Radiology*, 153, 189–194 (1984). Dixon employed shifted 180° RF pulses, or echo-times (TEs), to put the magnetization vectors of water and fat parallel and antiparallel, respectively, in a pair of images. Simple addition and subtraction of the two images in complex form yield separate images of the two chemical components, i.e., water and fat, provided that phase errors are negligible. Unfortunately, phase errors are always present in a realistic magnetic resonance image.

In order to overcome the phase error limitations of the Dixon method, the inventors have previously proposed a method of water-fat imaging with direct phase encoding (DPE). This method uses three general acquisition points to acquire three complex images, and provides two sets of general solutions of the two chemical components, namely, water and fat. The method resolves the image by selecting the correct set of solutions for each pixel, thus identifying water and fat. This application of the DPE method has been limited to water-fat imaging. A need exists for a simple but novel method to greatly improve, in both data acquisition and data processing, the efficiency of CSI having general applicability.

SUMMARY OF THE INVENTION

The present invention provides a method for chemical shift imaging (CSI) with spectrum modeling (CSISM), which is a generalization of DPE. As an extension of the DPE method for water-fat imaging, which models each voxel as a binary system of water and fat only, CSISM models the spectrum for each voxel as a general chemical shift spectrum with N distinct peaks.

The CSISM method of the invention models the general chemical shift spectrum as a system with N distinct peaks with known resonant frequencies and unknown amplitudes. Based on the N peak spectrum model, a set of nonlinear complex equations are set up that contain N+1 unknowns of two kinds: the magnitudes of the N peaks, and a phasor map caused by main magnetic field inhomogeneity. Using these equations, the timing parameters for shifting the 180° RF refocusing pulses for acquiring spin-echo images are optimally chosen. Using the chosen timing parameters, a plurality of spin-echo images are acquired. Next, acquired image data are automatically processed to solve the complex linear equations. First, the phasor map is found by fitting various phasor map values over a small number of pixels, or "seeds", that are picked sparsely in a field of view. Second, from the original "seeds", the region of pixels that are picked to find the best-fit phasor map is grown into the entire field of view, based on a predetermined phase difference between the original seed and a neighboring pixel. The optimal phasor map value thus found is then entered into the complex linear equations to derive the only unknown values at this point—the peak amplitudes. Optionally, second pass solutions of the peak amplitudes may be obtained using a smoothed phasor map value. Finally, when the equations are solved, the spectroscopic images are output.

Though the method of the present invention is described as applied in a spin-echo sequence, the method is applicable also in any other pulse sequences known in the art.

The method of the present invention translates the problem of spectroscopy into that of parameter determination, and, thus, is more efficient in both data acquisition and processing. These results are achieved because the CSISM outputs separate images of different chemical components modeled as N peaks with several data acquisitions. Furthermore, as more fully described below, CSISM models the chemical shift spectrum with only N+1 parameters, where N is typically 10 or less. As compared to the ordinary Fourier model in ordinary CSI that typically uses some 1000 coefficients, CSISM offers significantly improved efficiency. CSISM is capable of producing practical chemical shift images, with comparable quality in terms of spatial resolution, signal-to-noise ratio (SNR), and scan time as standard MRI, within a few minutes.

BRIEF DESCRIPTION OF THE DRAWINGS

The foregoing aspects and many of the attendant advantages of this invention will become more readily appreciated by reference to the following detailed description, when taken in conjunction with the accompanying drawings, wherein:

FIG. 2 is a spin-echo pulse sequence for acquiring a plurality of images, using optimized time shifts for the 180° RF refocusing pulses.

DETAILED DESCRIPTION OF THE PREFERRED EMBODIMENT

Figure 1:
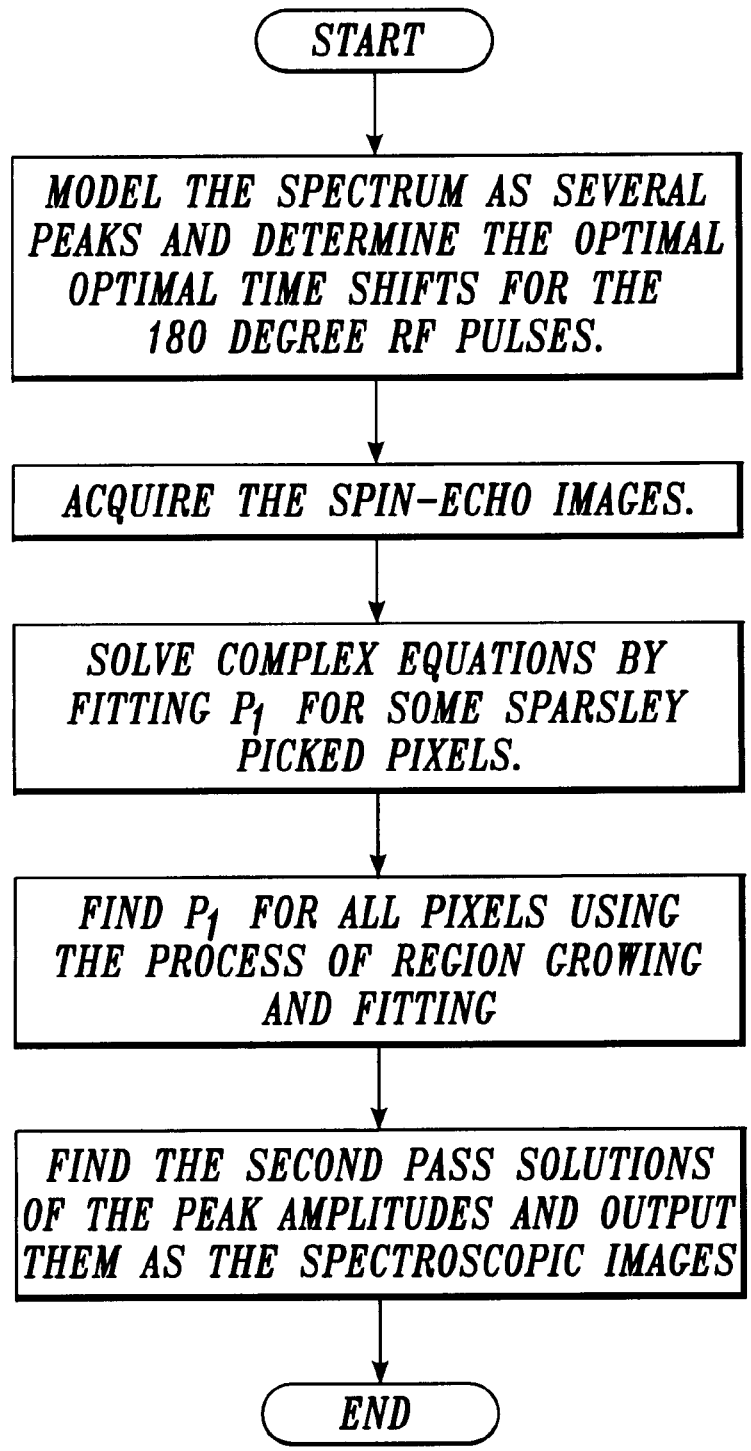
FIG. 1 is a flowchart illustrating major steps of the CSISM method in accordance with a preferred embodiment of the present invention.

FIG. 1 is a flowchart illustrating major steps of the chemical shift imaging with spectrum modeling (CSISM)

method in accordance with a preferred embodiment. Each of these steps is more fully described below. While the following describes the CSISM method as applied in a spin-echo sequence, it should be understood that the method is applicable also in any other pulse sequences known in the art, such as the gradient-echo, asymmetric spin-echo, fast-spin echo, and echo-planar image sequences.

(A) Modeling the spectrum as N peaks.

When a sample to be imaged is given, one or several localized nuclear magnetic resonance (NMR) spectroscopy experiments can be performed to obtain the NMR spectra of the sample, i.e., to measure the peak frequencies. Every primary peak in the spectra is associated with a certain chemical component, since each component has a unique resonant frequency. In the alternative, the spectrum model may be obtained based on published information. CSISM models the chemical spectrum thus obtained for every voxel as N delta-function-shaped peaks with known resonant frequencies but unknown amplitudes. This is equivalent to saying that every voxel in the sample consists of several chemical components, and all the components have fixed chemical shift values and no line broadening.

(B) Setting up nonlinear complex image equations.

Assume N peaks are found in the spectra of the sample with angular frequency shifts being $\delta\omega_1, \delta\omega_2, \ldots, \delta\omega_N$, respectively. Then, each voxel can be modeled as being composed of N distinctive chemical components with their magnetization vectors revolving clockwise at angular frequencies $\delta\omega_1, \delta\omega_2, \ldots, \delta\omega_N$ in the rotating frame of reference. The unknown amplitudes of these N magnetization vectors are labeled as $X_1, X_2, \ldots, X_N$, respectively. In order to resolve these unknown amplitudes, K spin-echo images $I_1, I_2, \ldots, I_K$ are acquired with the 180° refocusing pulse shifted by $M_1\Delta t, M_2\Delta t, \ldots, M_K\Delta t$, respectively, where $\Delta t$ is the minimum time shift unit, and $M_1, M_2, \ldots, M_K$ are integers with $M_1$ equaling zero.

The K complex images can be expressed as:

$$I_1 = (X_1 + X_2 + \ldots + X_N)P_0$$

$$I_2 = (A_1^{M_2}X_1 + A_2^{M_2}X_2 + \ldots + A_N^{M_2}X_N)P_0P_1^{M_2}$$

$$I_K = (A_1^{M_K}X_1 + A_2^{M_K}X_2 + \ldots + A_N^{M_K}X_N)P_0P_1^{M_K} \quad (1)$$

where $A_n$, with $n=1, 2, \ldots, N$, is a known phasor given by:

$$A_n = \exp(-i\, \delta\omega_n \Delta t) \quad (2)$$

which represents the orientation of the nth magnetization vector in the rotating frame at the unit time shift $\Delta t$. Hence the phasor $A_n^{M_k}$, with $k=1, 2, \ldots, K$, represents the orientation of the nth magnetization vector in the kth image which is acquired with a time shift $M_K\Delta t$. The parameter $P_0$ is a phasor map due to phase errors caused by factors such as RF field inhomogeneity or data acquisition window off-centering. The phasor map $P_0$ is a constant across the K images for a given pixel. Parameter $P_1$ is a phasor map caused by field inhomogeneity error and is given by:

$$P_1 = \exp(-i\gamma\Delta B_0 \Delta t) \quad (3)$$

where $\gamma$ is the averaged gyromagnetic ratio of the N chemical components, and $\Delta B_0$ is the field inhomogeneity map. The term $P_1^{M_k}$ in equations (1) represents the phase error caused by field inhomogeneity in the kth image which has a time shift $M_K\Delta t$.

Because $X_1, X_2, \ldots, X_N$ should have non-negative real values, $P_0$ is simply the phasor of $I_1$ and can be removed from equations (1). To reduce noise, $P_0$ can be calculated as the phasor of smoothed $I_1$ by a small sliding window (e.g., 7×7 pixels). By multiplying $P_0^*$ by $I_1, I_2, \ldots,$ and $I_K$ respectively, phase-corrected images $J_1, J_2, \ldots, J_K$ are obtained. Equations (1) are transformed into:

$$J_1 = X_1 + X_2 + \ldots + X_N$$

$$J_2 P_1^{-M_2} = A_1^{M_2}X_1 + A_2^{M_2}X_2 + \ldots + A_N^{M_2}X_N$$

$$J_K P_1^{-M_K} = A_1^{M_K}X_1 + A_2^{M_K}X_2 + \ldots + A_N^{M_K}X_N \quad (4)$$

Except the first equation in equations (4), all the other equations are complex value equations. Equations (4) can be split into 2K−1 real value equations:

$$J_1 = (X_1 + X_2 + \ldots + X_N)$$

$$\text{real}(J_2 P_1^{-M_2}) = \text{real}(A_1^{M_2})X_1 + \text{real}(A_2^{M_2})X_2 + \ldots + \text{real}(A_N^{M_2})X_N$$

$$\text{imag}(J_2 P_1^{-M_2}) = \text{imag}(A_1^{M_2})X_1 + \text{imag}(A_2^{M_2})X_2 + \ldots + \text{imag}(A_N^{M_2})X_N$$

$$\text{real}(J_K P_1^{-M_K}) = \text{real}(A_1^{M_K})X_1 + \text{real}(A_2^{M_K})X_2 + \ldots + \text{real}(A_N^{M_K})X_N$$

$$\text{imag}(J_K P_1^{-M_K}) = \text{imag}(A_1^{M_K})X_1 + \text{imag}(A_2^{M_K})X_2 + \ldots + \text{imag}(A_N^{M_K})X_N \quad (5)$$

where operators "real" and "imag" represent taking the real part and imaginary part of a complex number, respectively. In equations (5), there are N+1 unknown variables: $P_1$ and $X_1, X_2, \ldots, X_N$. If the number of equations 2K−1 is no less than the number of unknowns N+1, it is possible to solve equations (5), which can be expressed in matrix form as:

$$Y(P_1) = AX \quad (6)$$

where X is an unknown N-dimensional vector:

$$X = \begin{pmatrix} X_1 \\ X_2 \\ \vdots \\ X_N \end{pmatrix} \quad (7)$$

$Y(P_1)$ is a (2K−1) dimensional vector:

$$Y(P_1) = \begin{pmatrix} J_1 \\ \text{real}(J_2 P_1^{-M_2}) \\ \text{imag}(J_2 P_1^{-M_2}) \\ \vdots \\ \text{real}(J_K P_1^{-M_K}) \\ \text{imag}(J_K P_1^{-M_K}) \end{pmatrix} \quad (8)$$

A is a (2K−1)×N matrix:

$$A = \begin{pmatrix} 1 & 1 & \cdots & 1 \\ \text{real}(A_1^{M_2}) & \text{real}(A_2^{M_2}) & \cdots & \text{real}(A_N^{M_2}) \\ \text{imag}(A_1^{M_2}) & \text{imag}(A_2^{M_2}) & \cdots & \text{imag}(A_N^{M_2}) \\ \vdots & \vdots & \vdots & \vdots \\ \text{real}(A_1^{M_K}) & \text{real}(A_2^{M_K}) & \cdots & \text{real}(A_N^{M_K}) \\ \text{imag}(A_1^{M_K}) & \text{imag}(A_2^{M_K}) & \cdots & \text{imag}(A_N^{M_K}) \end{pmatrix} \quad (9)$$

(C) Determining the optimal time shifts for the 180° RF pulses.

The optimal timing parameters to shift the 180° RF pulses for image acquisitions are chosen to achieve the best data quality with a maximized data acquisition efficiency. Specifically, the unit time shift $\Delta t$ is chosen so that the reciprocal condition number of matrix $A^T A$ is as large as possible while keeping $\Delta t$ as small as possible. Thus, the parameters are dependent on the possible peak positions on the sample being studied. When matrix $A^T A$ is large and well conditioned, the inverse of matrix $A^T A$ will be stable and, as a result, the solutions will be more stable. Furthermore, when matrix $A^T A$ is well conditioned, the SNR of the final spectroscopic images will also be close to optimal.

(D) Acquiring spin-echo images.

FIG. 2 is a spin-echo pulse sequence for acquiring a plurality of images, using optimal time shifts $M_K \Delta t$ for the 180° refocusing RF pulses as derived in Section (C) above. Based on the N peak model as described in Section (A) above, several spin-echo images are collected with the 180° refocusing RF pulse shifted a different amount of time for every image, as is known in the art. As a result of the shifting, the magnetization vectors of the chemical components are put into different orientations across these spin-echo images. By shifting the images by the optimal time interval, as obtained above, the amplitudes of the magnetization vectors for different chemical components can be resolved from the complex images, as more fully described below. The number of images K for general CSISM must be so chosen that 2K−1 is equal to or greater than the number of unknown N+1 variables: $P_1$ and $X_1, X_2, \ldots, X_N$, to possibly solve the nonlinear equations (5).

(E) Solving the complex equations by fitting $P_1$ for some sparsely picked pixels.

After acquiring spin-echo images, CSISM solves the nonlinear equations (5) by first fitting $P_1$ whose magnitude is always 1 and its phase angle ranges from $-\pi$ to $\pi$. Typically, 360 different testing angles with a 1° increment per step are tried out for the phase angle of $P_1$. For each given $P_1$, equation (6) becomes a linear equation of X whose least-square error (LSE) solution is given by:

$$X = LY(P_1) \tag{10}$$

where L is an N×(2K−1) matrix given by:

$$L = (A^T A)^{-1} A^T \tag{11}$$

where operator "T" represents the transpose of a matrix and operator "−1" represents the inverse of a matrix. The least-square errors LSE for different values of $P_1$ can be calculated by:

$$\begin{aligned} LSE &= \text{energy}[Y(P_1) - AX] \\ &= \text{energy}[Y(P_1) - A(A^T A)^{-1} A^T Y(P_1)] \\ &= \text{energy}\{[U - A(A^T A)^{-1} A^T] Y(P_1)\} \end{aligned} \tag{12}$$

where operator "energy" returns the square sum of all the elements of a vector, and U is a (2K−1)×(2K−1) unit matrix. Different $P_1$ values usually result in different LSE values. The $P_1$ value with minimum LSE is selected as the correct answer for $P_1$, and the associated solutions of $X_1, X_2, \ldots, X_N$ are the correct results for the peak amplitudes.

The results for $P_1$ and $X_1, X_2, \ldots, X_N$ from the fitting process are reliable for pixels with balanced peak amplitudes. For pixels with only one chemical component or an insufficient number of chemical components, the results for $P_1$ and $X_1, X_2, \ldots, X_N$ are not reliable. From equation (12), it is not difficult to see that LSE is a polynomial function of $\cos(\Theta)$ and $\sin(\Theta)$, where $\Theta$ is the phase angle of $P_1$.

Therefore, a curve of LSE versus the phase angle of $P_1$ is a smooth curve with a limited number of local minimums. For a pixel with balanced peak amplitudes, the minimum value of LSE is significantly smaller than the other local minimums on the curve. Thus, it is easy to find the correct phase angle of $P_1$. For a pixel with a single peak or an insufficient number of peaks, the values of several local minimums will be very close. Thus, it is often impossible to tell which local minimum corresponds to the correct phase angle of $P_1$. To mathematically evaluate the reliability of the results for a pixel, a score S is calculated for the pixel by the following procedure. First, all the local minimums are identified by checking the testing phase angles of $P_1$ one by one. If the LSE value of a phase angle is smaller than or equal to the LSE value of its left neighbor and right neighbor, the LSE value at this phase angle is a local minimum. To avoid having extra local minimums due to round-off errors, no other local minimums are allowed in the proximity of an existing local minimum. Second, the global minimum and second minimum values are sorted out from the local minimums. The minimum value is labeled as $LSE_1$ and the second minimum value is labeled as $LSE_2$. Third, a score S is calculated for this pixel as:

$$S = (LSE_2 - LSE_1)/(E + C) \tag{13}$$

where E is the total energy of vector Y, i.e., the square sum of all the elements of Y, and C is a constant that can be chosen to be 10 times the averaged energy of vector Y for the pixels in the background noise. A pixel of noise can be roughly determined by checking its phase coherence with its neighboring pixels in the in-phase image $I_1$. When S is large, the results from the fitting process are reliable, and vice versa. In addition to the single peak or insufficient peaks problem, the computation time for the fitting process is also too long. To solve these problems, preferably only a small number of pixels are sparsely picked to calculate $P_1$.

(F) Finding $P_1$ for all pixels using the process of region growing and fitting.

As briefly discussed above, a small number of pixels, which are distributed uniformly in the whole field of view (FOV) (e.g., one pixel in every 8×8 pixels) except the regions of background noise, are picked as original seeds. The above-described fitting process is performed for each of these original seeds to calculate $P_1$ and score S. Then, the original seeds are sorted into an array with their scores in a descending order. The growing process begins from the original seed which has the highest score S. To avoid growing in noise, phase differences between the seed and its 4-connected neighboring pixels in the in-phase image $I_1$ are calculated. If the phase difference between the seed and a neighboring pixel is out of the range defined as, for example, ±10°, the neighboring pixel is discarded and will not be "grown" by this seed. On the other hand, if the phase difference between the seed and a neighboring pixel is within this range, the neighboring pixel qualifies to be grown and, as a result, $P_1$ and LSE values for the neighboring pixel will be calculated. With the $P_1$ value for the seed previously determined, the $P_1$ value for a neighboring pixel is quickly obtained by fitting the phase angle of $P_1$ in a small range (e.g., ±10°) around the phase angle of the seed, since $P_1$ should be a fairly smooth phasor map. After $P_1$ and minimum least-square error $LSE_1$ are obtained, an error ratio R is calculated for the neighboring pixel as:

$$R = LSE_1/(E + C) \tag{14}$$

where E and C are same defined as in equation (13). The $P_1$ value for the neighboring pixel is more reliable when R is smaller. The R values for the grown neighboring pixels are added to an empty red-black tree, as introduced in T. H. Cormen, et al. *INTODUCTION TO ALGORIMS,* The MIT Press, Cambridge, Mass., USA (1990). The grown pixels are labeled as "visited" to prevent them from being grown again. For the second round of growth, a newly grown pixel with minimum R is searched out from the red-black tree and acts as the seed for this round of growth. In each round of growth, there is only one seed. Four neighboring pixels of the seed are checked to see if they can be grown. If a neighboring pixel is phase coherent with the seed and has not been "visited" before, it is grown and its R value is added to the red-black tree. From searching the red-black tree, a pixel with the smallest R value is selected as the seed for the next round of growth, and its R value is removed from the red-black tree. This growing process continues until the red-black tree becomes empty.

The grown pixels from one original seed usually cover one piece of isolated tissue. There can be many pieces of isolated tissue in the whole FOV. In order to cover the whole FOV, the original seed with the second highest score is selected to start a new growth if the original seed has not been "visited" by the previous growths. All the original seeds will be used according to their order of score S. After the growing process stops, tissue in the whole FOV should be covered. Some leftover pixels in the background noise will not affect the result. From the growing process, the $P_1$ map in the whole FOV is obtained. Once the $P_1$ map is obtained, the equations (5) become linear equations of $X_1$, $X_2, \ldots, X_N$, and, thus, are quickly solved.

(G) Second pass solutions of the peak amplitudes.

The images of all the X elements can be obtained from the above process of region growing and fitting. For the improvement of image SNR, however, a second pass solution of X is calculated. First, the $P_1$ map is weighted and smoothed with a small sliding window (e.g., 9×9 pixels in size) to reduce the noise level in $P_1$. There will not be much useful information loss since $P_1$ should be a smooth phasor map. The weighting for each pixel in the smoothing operation is chosen to be the magnitude of image $I_1$. The smoothed $P_1$ map is substituted into equation (8), and the second pass solution of the X elements is directly given by equation (10).

(H) Outputting the spectroscopic images.

The images of the X elements as solved above are output as spectroscopic images, as known in the art.

The above-described CSISM method of the present invention has numerous applications. For example, water-fat-silicone imaging is a practical application of CSISM for patients with silicone implants in breasts. Breast implants contain silicone, which is a material chemically distinguishable from those existing in tissue such as water and fat. CSISM considers silicone as an additional well-defined peak to the ordinary binary water-fat system, and resolves these three peaks to provide high-quality images of water, fat, and silicone. The present invention thus provides an ideal way of monitoring breast implants efficiently to detect silicone leakage.

It should be understood that those skilled in the art can easily implement the above-described CSISM method in the form of computer software.

While the preferred embodiment of the invention has been illustrated and described, it will be appreciated that various changes can be made therein without departing from the spirit and scope of the invention as defined by the appended claims.

The embodiments of the invention in which an exclusive property or privilege is claimed are defined as follows:

1. A method of chemical shift imaging with spectrum modeling, the method comprising:

(a) modeling a chemical shift spectrum as N peaks having known resonant frequencies and unknown amplitudes;

(b) setting up nonlinear complex image equations for the N peaks modeled in (a), the equations having N+1 unknowns of two kinds: the magnitudes of the N peaks and a phasor map $P_1$ caused by main magnetic field inhomogeneity;

(c) determining optimal timing parameters based on the equations set up in (b);

(d) acquiring K images using the optimal timing parameters as determined in (c);

(e) finding an optimal value $P_1$ by fitting $P_1$ to pixels;

(f) solving the linear equations of (b) by using the optimal value $P_1$ found in (e); and (g) outputting the spectroscopic images based on the solutions found in (f).

2. The method of claim 1, wherein the N peaks are modeled as delta-function-shaped peaks with no line broadening.

3. The method of claim 1, wherein the number K of acquired images is chosen so that 2K−1 is equal to or greater than the number of unknowns N+1.

4. The method of claim 1, wherein the optimal time shifts vary among each other in a linearly increasing manner.

5. The method of claim 1, wherein the optimal time shifts are determined so as to maximize the condition number of a characteristic matrix of the equations.

6. The method of claim 1, wherein an initial value of $P_1$ is found by picking a small number of pixels distributed uniformly in a field of view as original seeds.

7. The method of claim 6, further including growing the number of pixels that are picked to find an optimal $P_1$ from the original seeds based on a predetermined phase difference between the original seed and a neighboring pixel.

8. The method of claim 7, wherein the region growing method uses a red-black tree.

9. The method of claim 1, further including obtaining second pass solutions of the peak amplitudes.

10. The method of claim 1, being applied in a spin-echo sequence.

* * * * *